United States Patent
Jo et al.

(10) Patent No.: US 11,837,171 B2
(45) Date of Patent: Dec. 5, 2023

(54) GATE DRIVER AND DISPLAY DEVICE INCLUDING SAME

(71) Applicant: LG Display Co., Ltd., Seoul (KR)

(72) Inventors: Sunghak Jo, Paju-si (KR); Taehee Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/531,398

(22) Filed: Nov. 19, 2021

(65) Prior Publication Data

US 2022/0199031 A1  Jun. 23, 2022

(30) Foreign Application Priority Data

Dec. 22, 2020 (KR) ........................ 10-2020-0180990

(51) Int. Cl.
```
G09G 3/32        (2016.01)
G09G 3/3266      (2016.01)
H10K 59/38       (2023.01)
H10K 59/88       (2023.01)
```
(52) U.S. Cl.
CPC ........... *G09G 3/3266* (2013.01); *H10K 59/38* (2023.02); *H10K 59/88* (2023.02); *G09G 2300/0842* (2013.01); *G09G 2310/08* (2013.01); *G09G 2320/0219* (2013.01)

(58) Field of Classification Search
CPC ......... G09G 2300/0426; G09G 3/3266; G09G 3/3233; G09G 2300/0408; G09G 2310/0286; G09G 2300/0439; G09G 2380/02; G09G 3/3275; G09G 2310/0264; G09G 3/3674; G09G 2300/0842; G09G 2310/08; G09G 2320/0219; G09G 2300/0413; G09G 2320/0295; G09G 2310/0267; G09G 2320/0209; G09G 3/32; H01L 27/3276; H01L 27/124; H01L 27/1214; H01L 51/0097; H01L 2924/1426; G02F 1/136286; G02F 1/13454; G02F 1/13685; G06F 3/0448; H10K 59/38; H10K 59/88; H10K 59/121

See application file for complete search history.

(56) References Cited

U.S. PATENT DOCUMENTS

| | | | |
|---|---|---|---|
| 6,396,470 B1 * | 5/2002 | Zhang | G09G 3/3677 |
| | | | 349/138 |
| 9,947,739 B2 * | 4/2018 | Song | H01L 51/0097 |
| 10,033,017 B2 * | 7/2018 | Kim | H01L 51/5284 |
| 11,022,833 B2 | 6/2021 | Fujikawa | |
| 2003/0016308 A1 | 1/2003 | Jeon | |

(Continued)

FOREIGN PATENT DOCUMENTS

| | | |
|---|---|---|
| JP | 2019203973 A | 11/2019 |
| KR | 10-1160822 B1 | 6/2012 |
| KR | 10-1266801 B1 | 5/2013 |

*Primary Examiner* — Lunyi Lao
*Assistant Examiner* — Jarurat Suteerawongsa
(74) *Attorney, Agent, or Firm* — SEED IP LAW GROUP LLP

(57) ABSTRACT

A gate driver includes: circuit parts having circuit elements thereon. The circuit parts are spaced apart from each other. Transparent parts are between the circuit parts. External light may pass through the transparent parts. Each of the circuit parts may include at least one circuit block. Each of the circuit blocks may be configured to perform the same function as others of the circuit blocks.

20 Claims, 11 Drawing Sheets

(56) References Cited

U.S. PATENT DOCUMENTS

| | | | |
|---|---|---|---|
| 2011/0157263 A1* | 6/2011 | Kim | G09G 3/3677 |
| | | | 345/698 |
| 2014/0049453 A1* | 2/2014 | Lee | G02F 1/133512 |
| | | | 345/55 |
| 2016/0149165 A1 | 5/2016 | Kim | |
| 2017/0110521 A1 | 4/2017 | Park et al. | |
| 2018/0083217 A1 | 3/2018 | Chung et al. | |
| 2019/0273122 A1* | 9/2019 | Iwasaki | H01L 51/524 |
| 2020/0168162 A1 | 5/2020 | Feng et al. | |
| 2020/0202779 A1* | 6/2020 | Chang | G09G 3/3233 |
| 2021/0090491 A1* | 3/2021 | Park | G09G 3/3233 |

\* cited by examiner

GATE DRIVER AND DISPLAY DEVICE INCLUDING SAME

CROSS REFERENCE TO RELATED APPLICATION

The present application claims priority to Korean Patent Application No. 10-2020-0180990, filed Dec. 22, 2020, the entire contents of which is incorporated herein for all purposes by this reference.

BACKGROUND

Technical Field

The present disclosure relates to a gate driver and a display device including the same. More particularly, the present disclosure relates to a gate driver having a transparent part, and relates to a display device including the gate driver.

Description of the Related Art

An organic light-emitting display device displays an image by using an organic light-emitting diode that generates light by electron-hole recombination. The organic light-emitting display device is a display device that is a self-emissive, and has fast response speed and low power consumption, so that the organic light-emitting display device has been spotlighted as a next generation display.

The organic light-emitting display device may be configured as a transparent display device by making a transistor or a light-emitting element inside the organic light-emitting display device to be in transparent form, or by separating a circuit area and a transmissive area from each other.

BRIEF SUMMARY

The inventors have realized that existing transparent display devices may include a non-display area, such as a bezel, and that visual appearance of a transparent image may be inconsistent across the display area and the non-display area. A technical benefit of the present disclosure is to provide a display device in which a visual difference between a display area and a non-display area is reduced in a transparent display device.

According to an embodiment of the present disclosure, a gate driver includes a plurality of circuit parts having circuit elements thereon. The plurality of circuit parts are spaced apart from each other. A plurality of transparent parts are disposed between the circuit parts. External light passes through the plurality of transparent parts. Each of the plurality of circuit parts may include at least one circuit block of a plurality of circuit blocks. Each of the plurality of circuit blocks may be configured to perform the same function as others of the plurality of circuit blocks.

The plurality of circuit parts may include a first extension part extending in a first direction. The circuit elements are on the first extension part. A second extension part of each of the plurality of circuit parts extends in a second direction perpendicular to the first direction. Second wirings are on the second extension part. The second wirings may provide coupling between circuit parts that are spaced apart from each other.

A width of the first extension part in the second direction may be larger than a width of the second extension part in the first direction.

A width of the first extension part in the second direction may be greater than a width of the second extension part in the first direction.

The gate driver may further include a plurality of first wirings configured to apply global signals to each of the circuit parts, wherein the global signals may include at least one of a scan clock signal, a carry clock signal, a start signal, a reset signal, a sensing selection signal, a first power source, a second power source, and a third power source.

The plurality of circuit parts may include: a first circuit part configured to control an output of a second gate signal provided to pixels for pixel sensing; a second circuit part configured to set a voltage of a Q node (or, "first node") disposed on the gate driver; a third circuit part configured to control an output of a carry signal provided to another stage that is disposed after a corresponding stage; a fourth circuit part configured to reset the voltage of the Q node and a voltage of a QB node (or, "second node") that is disposed on the gate driver, in response to the carry signal received from another stage that is disposed before the corresponding stage; a fifth circuit part configured to invert and output a signal applied to the Q node and the QB node; a sixth circuit part configured to output a first gate signal at a gate-off voltage through at least one pull-down transistor that is turned on in response to the voltage of the QB node; and a seventh circuit part configured to output the first gate signal at a gate-on voltage through at least one pull-up transistor that is turned on in response to the voltage of the Q node.

The first circuit part may be disposed adjacent to an edge of a first side of the gate driver.

The fourth circuit part may be disposed adjacent to the third circuit part that is configured to output the carry signal.

The sixth circuit part and the seventh circuit part may be disposed adjacent to an edge of a second side of the gate driver.

The seventh circuit part may include: a plurality of sub-circuit parts disposed to be spaced apart from each other; and the transparent parts disposed between the sub-circuit parts. The plurality of sub-circuit parts may include: first sub-circuit parts, each of which is configured as a part of the pull-up transistor; and second sub-circuit parts on which the first wirings configured to apply the scan clock signal to the pull-up transistor are disposed.

The first, second, third, fourth, fifth, sixth and seventh circuit parts may be referred to collectively as "the first through seventh circuit parts."

At least one of the first through seventh circuit parts may be configured to generate local signals beneficial for operating at least one other of the first through seventh circuit parts, and the local signals may include at least one of a Q node signal for controlling turn-on/turn-off of the pull-up transistor, a QB node signal for controlling turn-on/turn-off of the pull-down transistor, the carry signal CR, the first and the second gate signals, an M_o signal for charging/discharging the Q node, and the QB node for pixel sensing.

The circuit parts may include: a substrate; a circuit element layer (or, "first layer") disposed on the substrate, and on which the circuit elements are disposed; a planarization layer (or, "second layer") configured to cover the circuit elements that are disposed on the circuit element layer; a dummy reflective layer (or, "third layer") disposed on the planarization layer; and an encapsulation layer (or, "fourth layer") configured to cover the dummy reflective layer, wherein the dummy reflective layer may include a reflective electrode.

The circuit parts may include: a substrate; a circuit element layer disposed on the substrate, and having the circuit elements thereon; a planarization layer configured to cover the circuit elements that are disposed on the circuit element layer; an encapsulation layer formed on the planarization layer; a cover substrate disposed on an upper portion of the encapsulation layer; and a dummy color filter disposed between the encapsulation layer and the cover substrate, wherein the dummy color filter includes a photosensitive resin including a colorant.

According to an embodiment of the present disclosure, there is provided a display device including: a display panel including a display area having pixels thereon, and a non-display area that surrounds the display area; and a gate driver disposed on the non-display area. The gate driver is configured to apply a gate signal to the pixels through a gate line. Each of the display area and the non-display area may include: circuit parts having circuit elements thereon. The circuit parts are spaced apart from each other thereon. Transparent parts are between the circuit parts, and external light passes through the transparent parts.

The circuit parts may include: a first extension part extending in a first direction and having the circuit elements thereon; and a second extension part extending in a second direction perpendicular to the first direction and having second wirings thereon. The second wirings provide coupling between circuit parts that are spaced apart from each other. A width of the first extension part in the second direction may be larger than a width of the second extension part in the first direction.

The gate driver may include: a first circuit part configured to control an output of a second gate signal provided to the pixels for pixel sensing; a second circuit part configured to set a voltage of a Q node disposed on the gate driver; a third circuit part configured to control an output of a carry signal provided to another stage that is disposed after a corresponding stage; a fourth circuit part configured to reset the voltage of Q node and a voltage of a QB node that is disposed on the gate driver, in response to the carry signal received from another stage that is disposed before the corresponding stage; a fifth circuit part configured to invert and output a signal applied to the Q node and the QB node; a sixth circuit part configured to output a first gate signal at a gate-off voltage through at least one pull-down transistor that is turned on in response to the voltage of the QB node; and a seventh circuit part configured to output the first gate signal at a gate-on voltage through at least one pull-up transistor that is turned on in response to the voltage of the Q node.

The first circuit part may be disposed adjacent to an edge of the display panel in the non-display area, and the sixth and the seventh circuit parts may be disposed adjacent to the display area.

The fourth circuit part may be disposed adjacent to the third circuit part that is configured to output the carry signal.

The seventh circuit part may include: a plurality of sub-circuit parts disposed to be spaced apart from each other; and the transparent parts disposed between the sub-circuit parts, wherein the plurality of the sub-circuit parts may include: first sub-circuit parts, each of which is configured as a part of the pull-up transistor; and second sub-circuit parts on which first wirings configured to apply a scan clock signal to the pull-up transistor are disposed.

The circuit parts in the display area may include: a substrate; a circuit element layer disposed on the substrate, and having the circuit elements thereon; a planarization layer configured to cover the circuit elements that are disposed on the circuit element layer; a light-emitting element layer disposed on the planarization layer and provided with light-emitting elements including an anode electrode, a cathode electrode, and a light-emitting layer disposed between the anode electrode and the cathode electrode; an encapsulation layer configured to cover the light-emitting element layer; a cover substrate disposed on an upper portion of the encapsulation layer; and a color filter disposed between the encapsulation layer and the cover substrate, and wherein the circuit parts in the non-display area may include: the substrate; the circuit element layer; the planarization layer; a dummy reflective layer disposed on the planarization layer; and the encapsulation layer configured to cover the dummy reflective layer, wherein the dummy reflective layer may be formed of the same material as the anode electrode.

The circuit parts in the display area may include: a substrate; a circuit element layer disposed on the substrate, and on which the circuit elements are disposed; a planarization layer configured to cover the circuit elements that are disposed on the circuit element layer; a light-emitting element layer disposed on the planarization layer and provided with light-emitting elements including an anode electrode, a cathode electrode, and a light-emitting layer disposed between the anode electrode and the cathode electrode; an encapsulation layer configured to cover the light-emitting element layer; a cover substrate disposed on an upper portion of the encapsulation layer; and a color filter disposed between the encapsulation layer and the cover substrate, and wherein the circuit parts in the non-display area may include: the substrate; the circuit element layer; the planarization layer; the encapsulation layer disposed on the planarization layer; the cover substrate; and a dummy color filter disposed between the encapsulation layer and the cover substrate, wherein the dummy color filter may be formed of the same material as the color filter.

The pixels may include red (R), green (G), and blue (B) pixels, and the circuit parts of the gate driver may have the same size and shape as the R, G, and B pixels.

The transparent parts disposed on the display area and the transparent parts disposed on the non-display area may have substantially the same shape.

In the display device according to an embodiment of the present disclosure, the gate driver disposed on the non-display area is formed of the circuit part and the transparent part in the same manner as in the display area, so that a visual difference between the display area and the non-display area may be reduced.

BRIEF DESCRIPTION OF THE SEVERAL VIEWS OF THE DRAWINGS

The above and other technical benefits, features, and other advantages of the present disclosure will be more clearly understood from the following detailed description when taken in conjunction with the accompanying drawings, in which.

DETAILED DESCRIPTION

Figure 1:
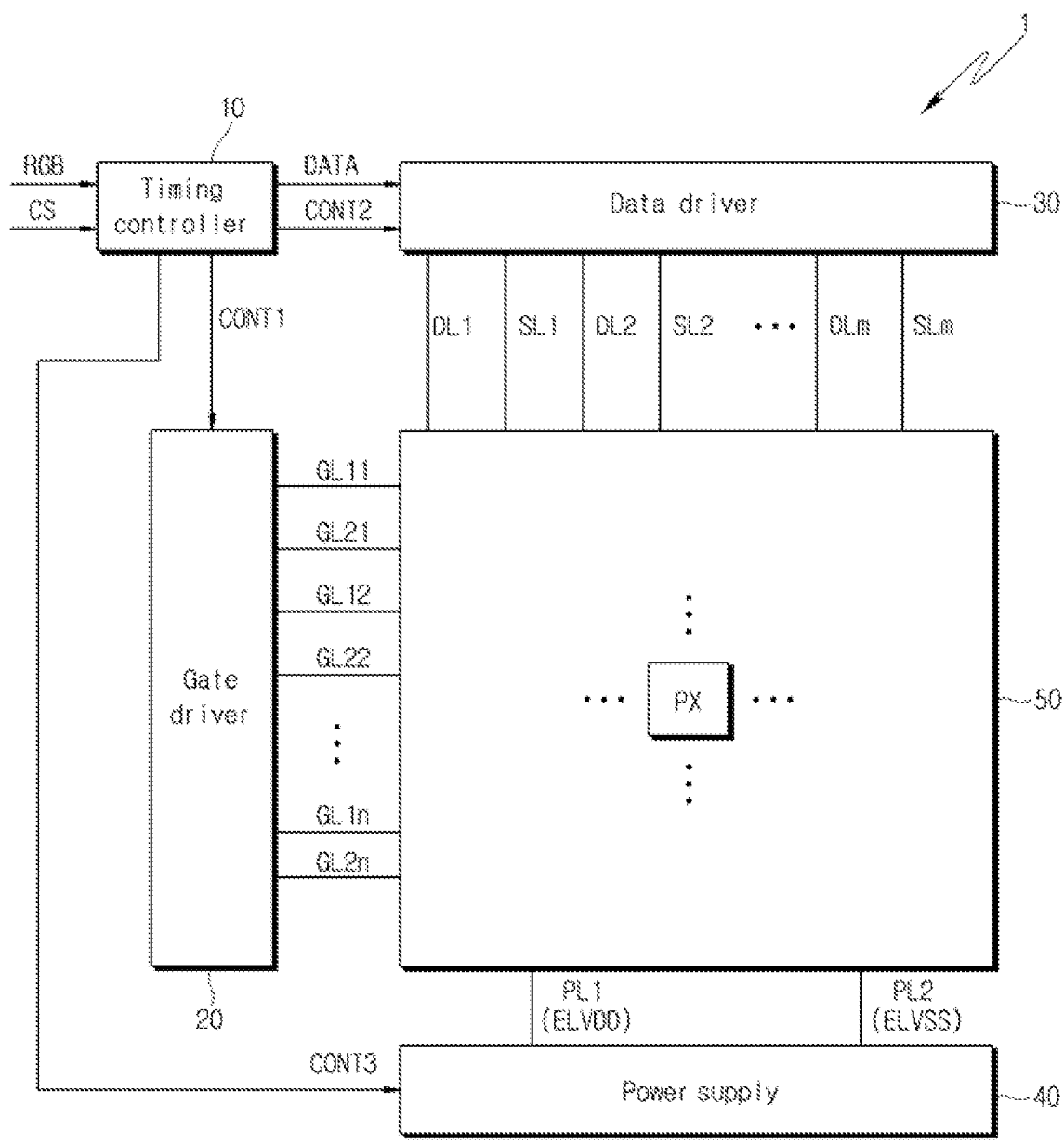
FIG. 1 is a block diagram illustrating a configuration of a display device according to an embodiment of the present disclosure.

Hereinafter, embodiments of the present disclosure will be described in detail with reference to the accompanying drawings. In this specification, it will be understood that when one component (or region, layer, portion) is referred to as being "on," "connected to," or "coupled to" another component, it can be directly disposed/connected/coupled on/to the one component, or an intervening third component may also be present.

Like reference numerals refer to like elements throughout. Also, in the drawings, the thickness, ratio, and dimensions of components are exaggerated for clarity of illustration. The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under," "below," "above," "upper," and the like are used for explaining relation association of components illustrated in the drawings. The terms may be a relative concept and described based on directions expressed in the drawings.

The meaning of the term "include" or "comprise" specifies a property, a fixed number, a step, an operation, an element, a component or a combination thereof, but does not exclude other properties, fixed numbers, steps, operations, elements, components or combinations thereof.

FIG. 1 is a block diagram illustrating a configuration of a display device according to an embodiment of the present disclosure.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include a plurality of gray scale data. The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be coupled to pixels PXs of the display panel 50 through multiple first gate lines GL11 to GL1n. The gate driver 20 may generate gate signals on the basis of the gate driving control signal CONT1 output from the timing controller 10. The gate driver 20 may provide the generated gate signals to the pixels PXs through the multiple first gate lines GL11 to GL1n.

In various embodiments, the gate driver 20 may be further coupled to the pixels PXs of the display panel 50 through multiple second gate lines GL21 to GL2n. The gate driver 20 may provide a sensing signal to the pixels PXs through the multiple second gate lines GL21 to GL2n.

The data driver 30 may be coupled to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm.

In various embodiments, the data driver 30 may be further coupled to the pixels PXs of the display panel 50 through multiple sensing lines (or reference lines) SL1 to SLm. The data driver 30 may provide a reference voltage (a sensing voltage, or an initialization voltage) to the pixels PXs through the multiple sensing lines SL1 to SLm, or may sense states of the pixels PXs on the basis of an electrical signal fed back from the pixels PXs.

The power supply 40 may be coupled to the pixels PXs of the display panel 50 through multiple power lines PL1 and PL2. The power supply 40 may generate a driving voltage (for example, a high-potential driving voltage ELVDD and a low-potential driving voltage ELVSS) to be provided to the display panel 50, on the basis of the power supply control signal CONT3. The power supply 40 may provide the generated driving voltages ELVDD and ELVSS to the pixels PXs, through the corresponding power lines PL1 and PL2.

In the display panel 50, the multiple pixels PXs (or referral to as sub-pixels) are disposed. The pixels PXs may be, for example, arranged in a matrix form on the display panel 50. The pixels PXs may emit light with luminance corresponding to the gate signals and the data signals that are supplied through the first gate lines GL11 to GL1n and the data lines DL1 to DLm, respectively. Each pixel PX may display any one among red, green, blue, and white colors.

Figure 2:
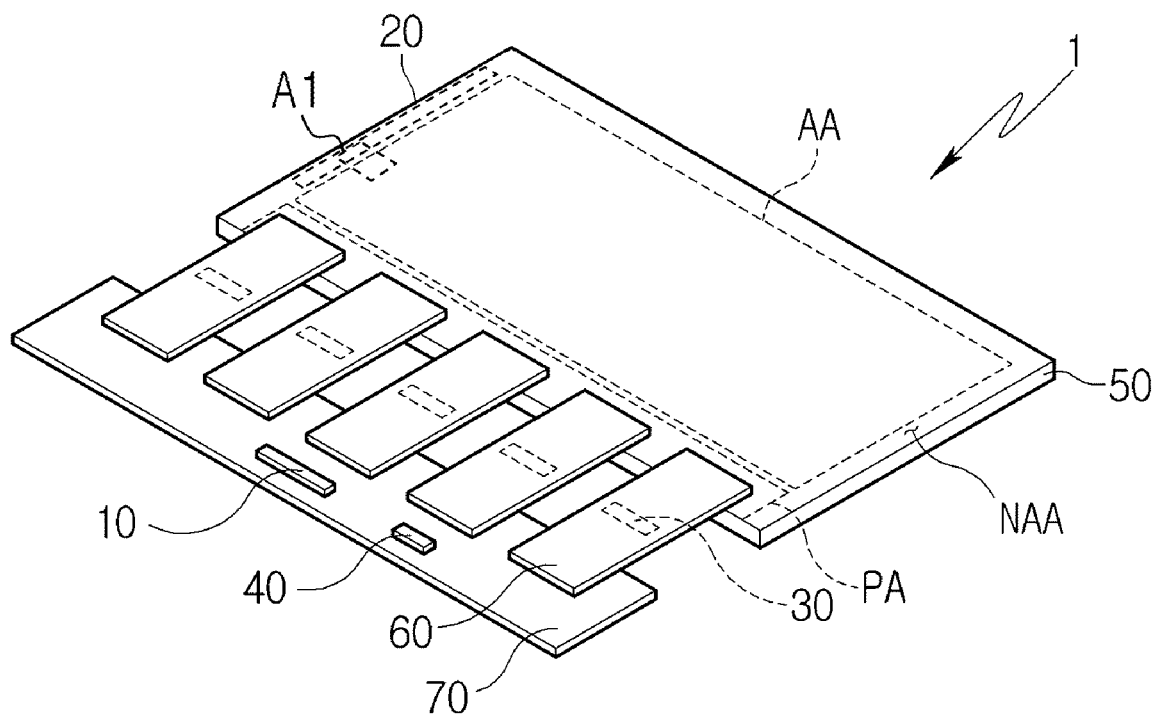
FIG. 2 is a perspective view schematically illustrating the display device illustrated in FIG. 1.

FIG. 2 is a perspective view schematically illustrating the display device illustrated in FIG. 1.

The display device 1 may be implemented in various shapes. For example, the display device 1 may be implemented in a shape of a rectangular plate.

The display panel 50 includes a display area AA and a non-display area NAA. The display area AA is an area on which the pixels PXs are disposed, and may be referred to as an active area. The non-display area NAA may be disposed adjacent to the display area AA.

In the non-display area NAA, as a driver for driving the pixels PXs, for example, the gate driver 20 may be provided. The gate driver 20 may be formed in the non-display area NAA of the display panel 50 in a gate-in-panel manner as shown in FIG. 2.

In the non-display area NAA, multiple pads (not illustrated) may be provided. The pads may not be covered by an insulation layer, but may be exposed to the outside of the display panel 50 and may be electrically coupled to the data driver 30, a circuit board 70, and the like.

A flexible film 60 is provided with a first end attached to a pad area PA of the display panel 50, and is provided with a second end attached to the circuit board 70, so that the display panel 50 and the circuit board 70 may be electrically coupled. The flexible film 60 may include multiple wirings for electrically connecting the pads formed in the pad area PA and wirings of the circuit board 70.

The circuit board 70 may be a printed circuit board or a flexible printed circuit board. The circuit board 70 may include the timing controller 10 and the power supply 40 that are mounted in the form of an integrated circuit.

Figure 3:
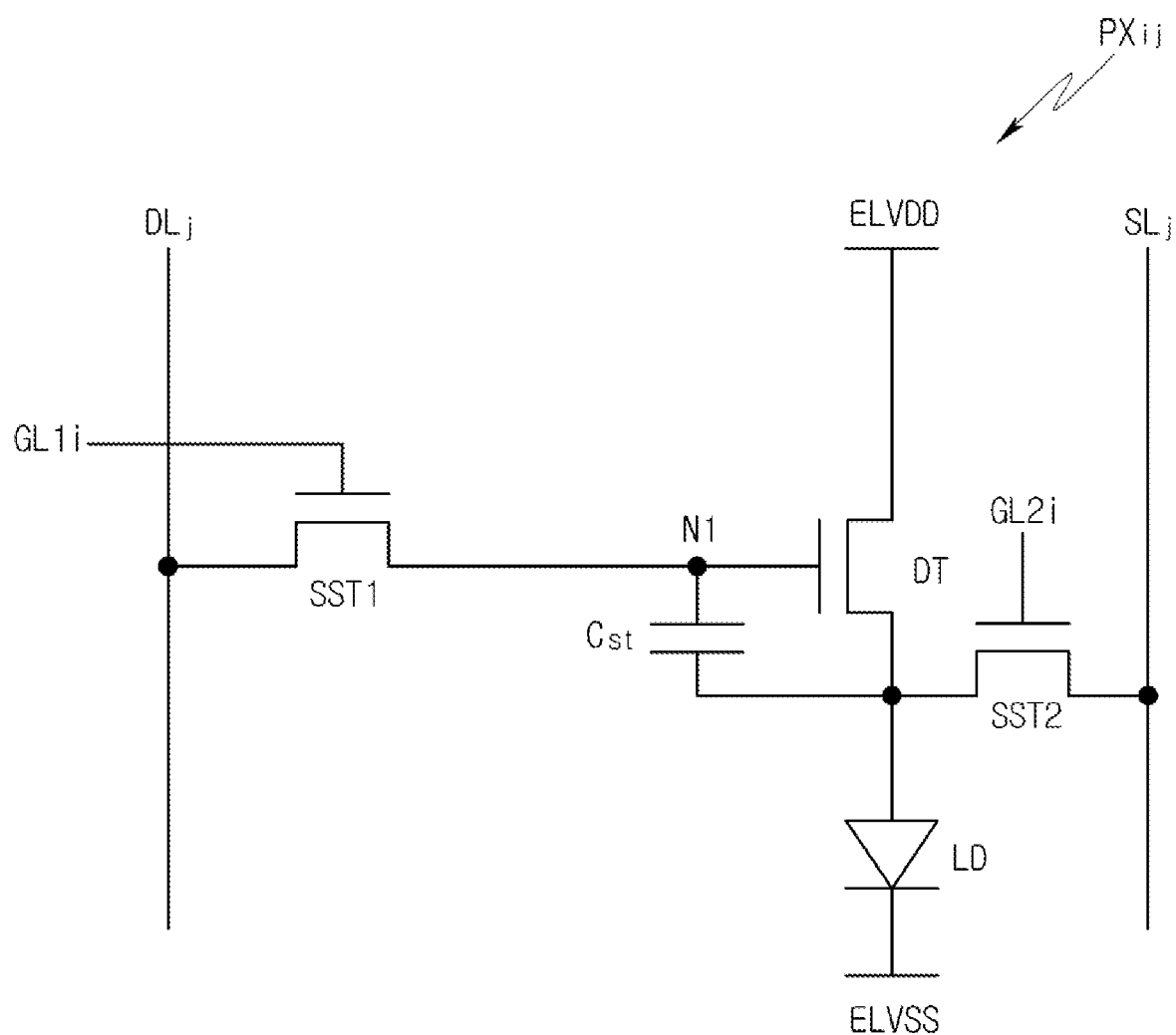
FIG. 3 is a circuit diagram illustrating an embodiment of a pixel illustrated in FIG. 1.

FIG. 3 is a circuit diagram illustrating an embodiment of a pixel illustrated in FIG. 1. FIG. 3 illustrates, as an example, a pixel PXij that is coupled to i-th gate lines GL1i and GL2i and a j-th data line DLj.

Referring to FIG. 3, the pixel PX includes a switching transistor SST1, a driving transistor DT, a sensing transistor SST2, a storage capacitor Cst, and a light-emitting element LD.

A first electrode (for example, a drain electrode) of the switching transistor SST1 is electrically coupled to the j-th data line DLj, and a second electrode (for example, a source electrode) of the switching transistor SST1 is electrically coupled to a first node N1. A gate electrode of the switching transistor SST1 is electrically coupled to the i-th first gate line GL1i. The switching transistor SST1 is turned on when a gate signal at a gate-on level is applied through the i-th first gate line GL1i, and transmits a data signal applied through the j-th data line DLj, to the first node N1.

A first electrode of the storage capacitor Cst is electrically coupled to the first node N1, and a second electrode of the storage capacitor Cst is coupled to a first electrode of the light-emitting element LD. The storage capacitor Cst may be charged with a voltage corresponding to the difference between a voltage applied to the first node N1 and a voltage applied to the first electrode of the light-emitting element LD.

A first electrode (for example, a drain electrode) of the driving transistor DT receives the high-potential driving voltage ELVDD, and a second electrode (for example, a source electrode) of the driving transistor DT is electrically coupled to a first electrode (for example, an anode electrode) of the light-emitting element LD. A gate electrode of the driving transistor DT is electrically coupled to the first node N1. The driving transistor DT is turned on when a voltage at a gate-on level is applied through the first node N1, and may control the amount of a driving current flowing to the light-emitting element LD depending on a voltage provided to the gate electrode.

A first electrode (for example, a drain electrode) of the sensing transistor SST2 is electrically coupled to a j-th sensing line SLj, and a second electrode (for example, a source electrode) of the sensing transistor SST2 is electrically coupled to the first electrode (for example, the anode electrode) of the light-emitting element LD. A gate electrode of the sensing transistor SST2 is electrically coupled to an i-th second gate line GL2i. The sensing transistor SST2 is turned on when a sensing signal at a gate-on level is applied through the i-th second gate line GL2i, and transmits a reference voltage applied through the j-th sensing line SLj, to the first electrode of the light-emitting element LD.

The light-emitting element LD outputs light corresponding to the driving current. The light-emitting element LD may output light corresponding to any one among red, green, blue, and white colors. The light-emitting element LD may be an organic light-emitting diode (OLED).

Figure 4:
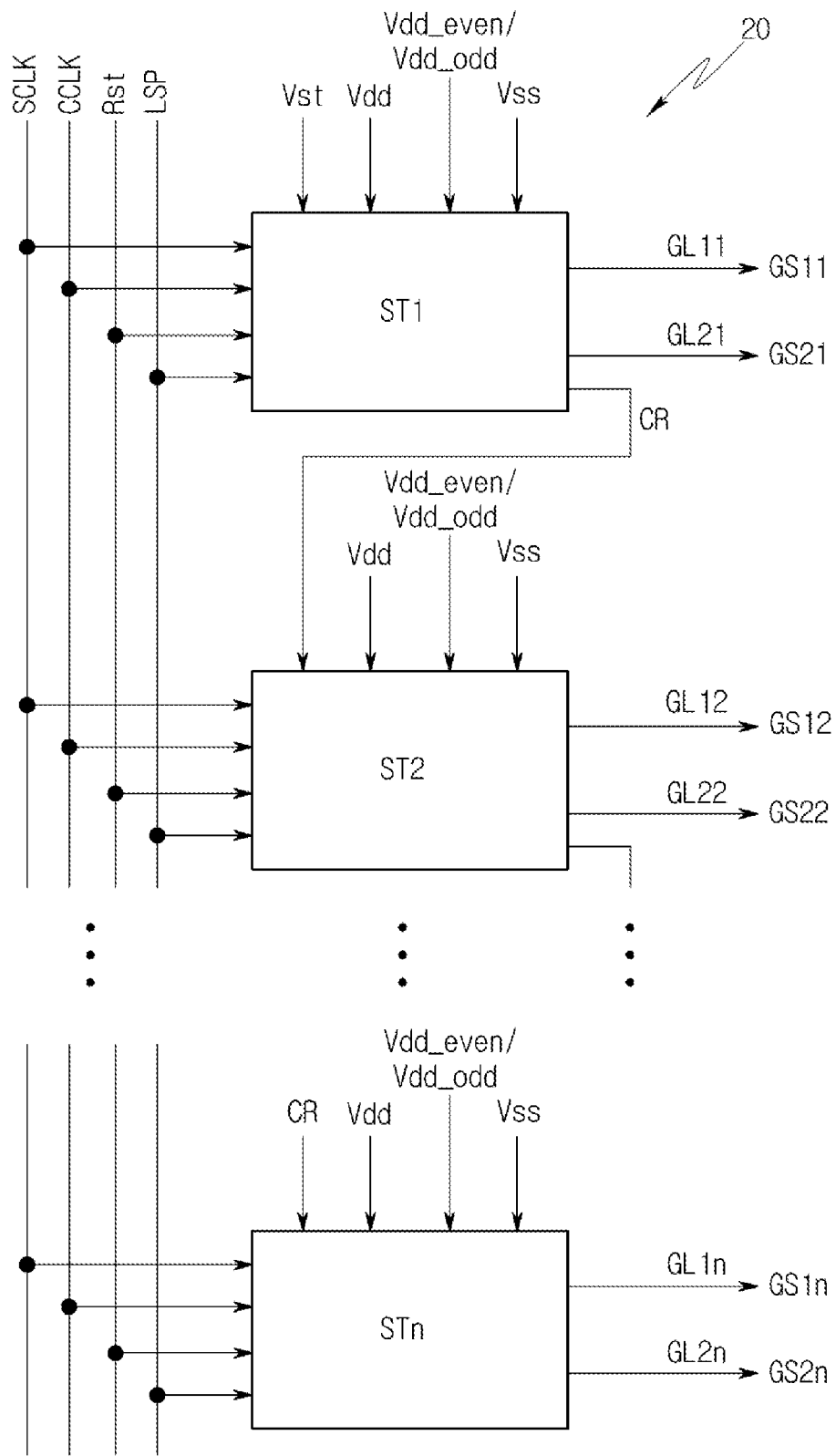
FIG. 4 is a view schematically illustrating a gate driver illustrated in FIG. 1.
Figure 5:
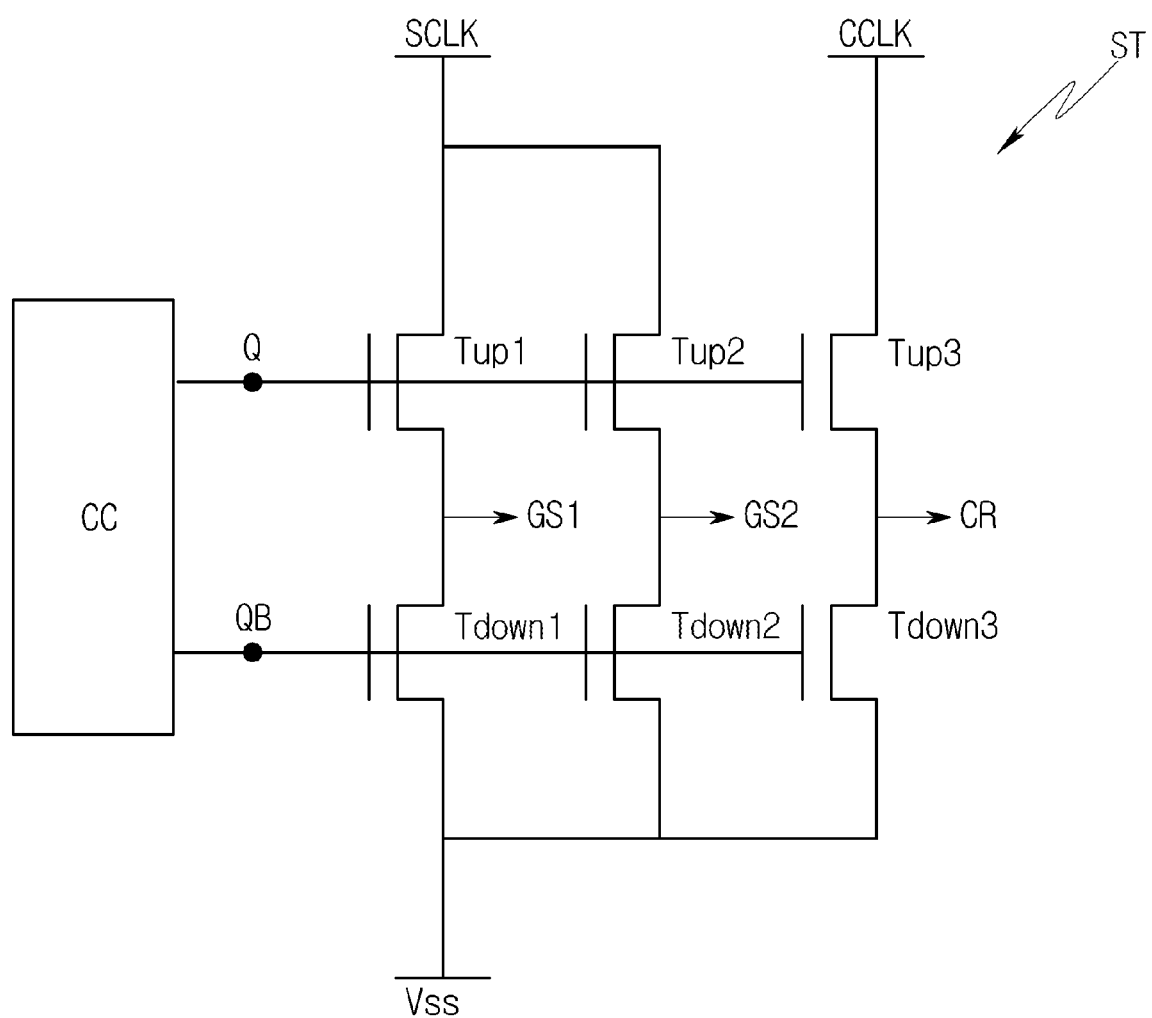
FIG. 5 is a circuit diagram illustrating an operation of stages illustrated in FIG. 4.

FIG. 4 is a view schematically illustrating the gate driver illustrated in FIG. 1, and FIG. 5 is a circuit diagram illustrating an operation of stages illustrated in FIG. 4.

Referring to FIG. 4, the gate driver 20 includes multiple stages ST1 to STn. The stages ST1 to STn include multiple input terminals for respectively receiving a scan clock signal SCLK, a carry clock signal CCLK, a start signal Vst/a carry signal CR from the previous stage, a reset signalRst, a sensing selection signal LSP, a first power source Vdd, a second power source Vdd_even/Vdd_odd, and a third power source Vss that may be applied as a global signal. In addition, the stages ST1 to STn include multiple output terminals respectively coupled any one among the first gate lines GL11 to GL1n and any one among the second gate lines GL21 to GL2n. Such stages ST1 to STn may supply the first gate signals GS11 to GS1n to the first gate lines GL11 to GL1n and may supply the second gate signals GS21 to GS2n to the second gate lines GL21 to GL2n in response to global signals that are input and local signals that are generated inside the stages ST1 to STn.

The stages ST1 to STn are provided with the scan clock signal SCLK and the carry clock signal CCLK. The scan clock signal SCLK and the carry clock signal CCLK are illustrated as a single signal each, but may be formed of multiple clock signals. For example, the scan clock signal SCLK may be formed of first to i-th scan clock signals, and the carry clock signal CCLK may be formed of first to i-th carry clock signals.

The scan clock signals SCLK and the carry clock signals CCLK may be a square wave signal in which a high voltage and a low voltage are repeated. The high voltage may be greater than the low voltage. Here, a high voltage period corresponds to a width of a gate signal, and may be variously set depending on a circuit structure of the pixel PX and in an operation manner of the pixel PX.

In various embodiments, the scan clock signals SCLK may be set to signals having the same cycle and may have phases shifted from each other. For example, the first to the i-th scan clock signals may be signals having forms shifted by 1/i cycle from a previous scan clock signal. Similarly, the carry clock signals CCLK may be set to signals having the same cycle and may have phases shifted from each other. For example, the first to the i-th carry clock signals may be signals having forms shifted by 1/i cycle from a previous carry clock signal. In various embodiments, the carry clock signals CCLK may be signals that are synchronized to the corresponding scan clock signals SCLK, respectively. However, the embodiment is not limited thereto.

Referring to FIG. 5, each stage ST may include pull-up transistors Tup1, Tup2, and Tup3, and may include a control circuit CC for controlling operation states of the pull-up transistors Tup1, Tup2, and Tup3. A gate of the first pull-up transistor Tup1 is coupled to a Q node Q, and is turned on when the Q node Q is set to a gate-on voltage, so that the scan clock signal SCLK at a gate-on level may be output as the first gate signal to the first gate lines G11 to G1n. A gate of the second pull-up transistor Tup2 is coupled to the Q node Q, and is turned on when the Q node Q is set to the gate-on voltage, so that the scan clock signal SCLK at the gate-on level may be output as the second gate signal to the second gate lines G21 to G2n. The third pull-up transistor Tup3 is turned on in response to a voltage applied to a gate of the third pull-up transistor Tup3, and may output the carry clock signal CCLK at the gate-on level as a carry signal CR.

The stages ST1 to STn may receive the start signal Vst or the carry signal CR output from the previous stage. The start signal Vst may be input to an input terminal of the first stage ST1, and the carry signal CR from the previous stage may be input to stages other than the first stage ST1. Here, the carry signal CR may be a carry signal CR which is output from any one of the stages previously arranged in that stage. A generation timing and an output timing of the first and the second gate signals GS11 to GS1$n$ and GS21 to GS2$n$ may be controlled by the supply of the start signal Vst at the gate-on level or the carry signal CR from the previous stage to the stages ST1 to STn.

The stages ST1 to STn may receive the reset signal RST. The reset signal RST is supplied to the stages ST1 to STn during a reset period in one frame, so that a voltage of the Q node Q and a QB node QB illustrated in FIG. 5 may be initialized. In an embodiment, by the reset signal RST, the Q node Q may be charged and the QB node QB may be discharged. In an embodiment, the reset period may be included in a vertical blank period in one frame. More particularly, the reset period may be arranged after the sensing period.

The stages ST1 to STn may receive the sensing selection signal LSP. The sensing selection signal LSP is a signal for controlling the output of the second gate signals GS21 to GS2$n$ during the sensing period in one frame. In one embodiment, only the stage that receives the sensing selection signal LSP at the gate-on level may be controlled to output the second gate signals GS21 to GS2$n$ during the sensing period. During the sensing period, a movement of the driving transistor TD, a threshold voltage, and current characteristics of the light-emitting element LD may be sensed for the pixels PXs that have the second gate signal GS21 to GS2$n$ applied. In an embodiment, the sensing period may be included in the vertical blank period in one frame.

The first power source Vdd is a voltage applied to charge the Q node Q, and may be electrically coupled to the Q node Q. Such first power source Vdd may be set to a gate-on level that is sufficient to turn on the pull-up transistors Tup1, Tup2, and Tup3 that are coupled to the Q node Q.

The second power source Vdd_even/Vdd_odd is a voltage applied to charge the QB node QB, and may be electrically coupled to the QB node QB. Such the second power source Vdd_even/Vdd_odd may be set to a gate-on level that is sufficient to turn on pull-down transistors Tdown1, Tdown2, and Tdown3 that are coupled to the QB node QB.

The third power source Vss may be a voltage for grounding the stages ST1 to STn and for generating both the gate signals GS11 to GS1$n$ and GS21 to GS2$n$ at the gate-off level and the carry signal CR.

Referring to FIG. 5, the stages ST1 to STn may include the pull-down transistors Tdown1, Tdown2, and Tdown3, and may include the control circuit CC for controlling operation states of the pull-down transistors Tdown1, Tdown2, and Tdown3. A gate of the first pull-down transistor Tdown1 is coupled to the QB node QB, and is turned on when the QB node QB is set to a gate-on voltage, so that the third power source Vss at the gate-off level may be output as the first gate signal to the first gate lines G11 to G1$n$. A gate of the second pull-down transistor Tdown2 is coupled to the QB node QB, and is turned on when the QB node QB is set to a gate-on voltage, so that the third power source Vss at the gate-off level may be output as the second gate signal to the second gate lines G21 to G2$n$. The third pull-down transistor Tdown3 is turned on in response to a voltage applied to the gate of the third pull-down transistor Tdown3, and may output the third power source Vss at the gate-off level as the carry signal CR.

In FIGS. 4 and 5, all of the stages ST1 to STn are coupled to the single third power source Vss. However, the embodiment is not limited thereto, and the stages ST1 to STn may be coupled to multiple low-potential power sources. For example, considering the characteristics of circuit elements that configure the gate driver 20 and considering the circuit elements that configure the pixel PX and considering the power consumption of the display device 1, the first and the second pull-down transistors Tdown1 and Tdown2 and the third pull-down transistor Tdown3 may be coupled to different low-potential power sources.

In various embodiments, the stages ST1 to STn illustrated in FIG. 5 may be formed of multiple circuit parts that are separate from each other. Hereinafter, detailed embodiments of the stages ST1 to STn will be described.

Figure 6:
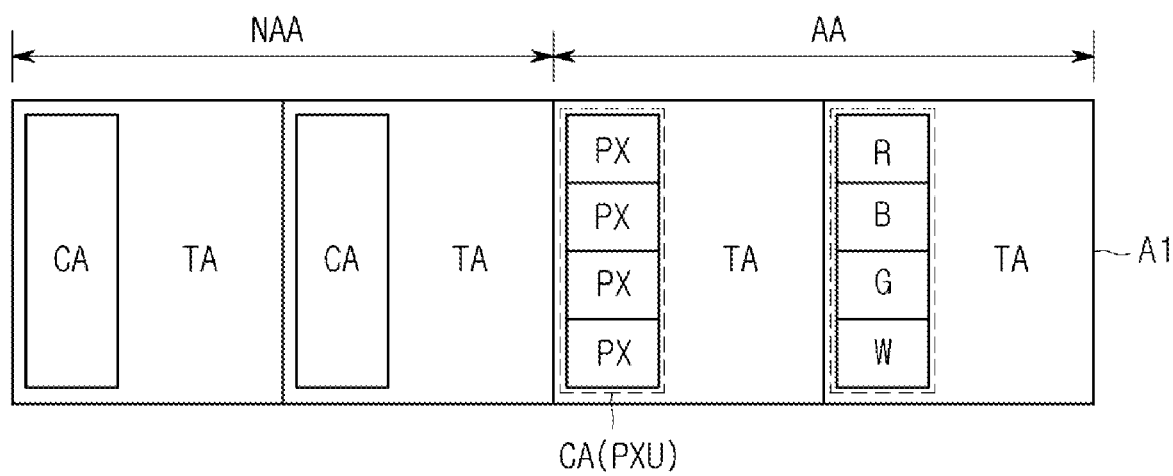
FIG. 6 is an enlarged view of an embodiment of an area illustrated in FIG. 2.
Figure 7:
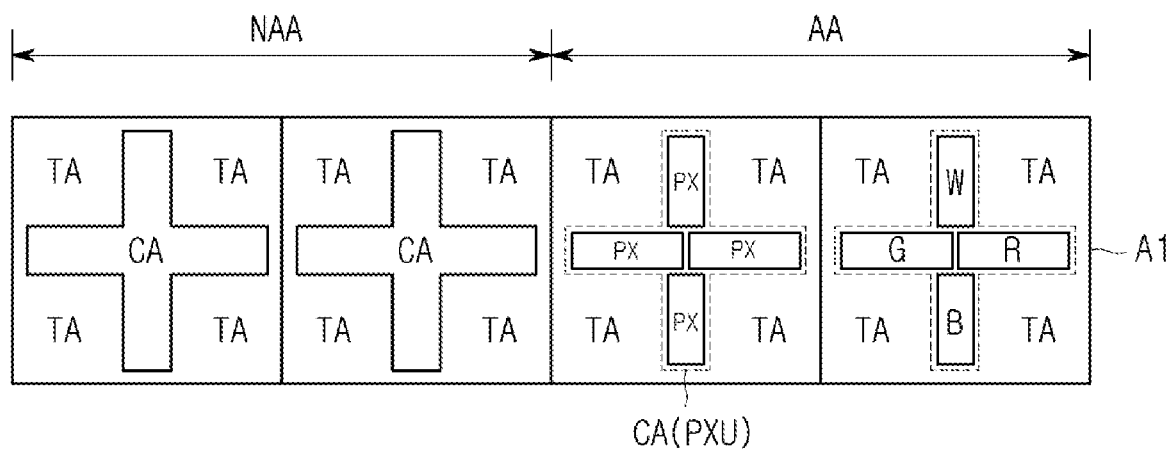
FIG. 7 is an enlarged view of another embodiment of the area illustrated in FIG. 2.

FIG. 6 is an enlarged view of an embodiment of an area A1 illustrated in FIG. 2. FIG. 7 is an enlarged view of another embodiment of the area A1 illustrated in FIG. 2.

Referring to FIGS. 6 and 7, the display panel 50 according to an embodiment of the present disclosure includes a display area AA and a non-display area NAA. Each of the display area AA and the non-display area NAA includes a circuit part CA and a transparent part TA. The transparent part TA and the circuit part CA may be disposed adjacent to each other and in a continuous manner, without a physical separation. The region in which the circuit part CA is located can be called a circuit area, CA, namely it is area of the region in which circuits are located. This circuits themselves can be located in different layers, and thus can be in the X, Y and/or Z planes. This is described in more detail with respect to FIGS. 11 and 12. The extension of the circuit region in the X and Y planes is the circuit area and can be considered the area occupied by the circuit parts CA. Similarly, the region in which the transparent part TA is located is the area occupied by the transparent part.

In the display area AA and in the non-display area NAA, the circuit parts CA and the transparent parts TA generally have the same size and shape, and may be arranged in the same manner. Therefore, the display area AA and the non-display area NAA may have the same visual sensation, and the display device 1 may effectively function as a transparent display device.

Here, meaning of the term "same" includes a deviation considering a process margin. For example, in the display area AA and the non-display area NAA, both the circuit parts CA and the transparent parts TA may include a size change (process margin) within a several μm on a first side thereof. For example, for the first side of the transparent part TA in the display area AA, the first side of the transparent part TA in the non-display area NAA may be arranged to be larger or smaller in a left/right direction and an up/down direction within a range of 5 μm. In addition, for the first side of the circuit part CA in the display area AA, the first side of the circuit part CA in the non-display area NAA may be arranged to be larger or smaller in the left/right direction and the up/down direction within the range of 5 μm. The same manner will be applied in embodiments below.

In the display area AA, at least one circuit element that configures the pixel PX, a light-emitting element coupled to the circuit elements, and wirings connecting therebetween may be disposed on the circuit part CA. In an embodiment, one unit pixel PXU may be disposed on one circuit part CA. For example, the unit pixel PXU may be formed of all or part of the pixels PXs respectively illuminated in red, green, blue, and white colors. In an embodiment, different color combinations of the unit pixels PXUs may be disposed on the circuit part CA.

In the non-display area NAA, circuit elements for driving the pixel PX may be disposed on the circuit part CA. For example, in the non-display area NAA, the circuit elements that configure the gate driver 20 may be disposed on the circuit part CA. As described above, the circuit part CA in the display area AA and the circuit part CA in the non-display area NAA generally be similar in size and shape. Generally, a gate driver that configures the gate driver 20 includes more circuit elements than the unit pixel PXU and has a larger area. Therefore, in order to form the size and shape of the circuit part CA in the display area AA and the non-display area NAA to be generally the same, one stage ST may be implemented across the multiple circuit parts CA. At this time, the circuit parts CA may be separated from each other by positioning the transparent part TA therebetween.

Figure 11:
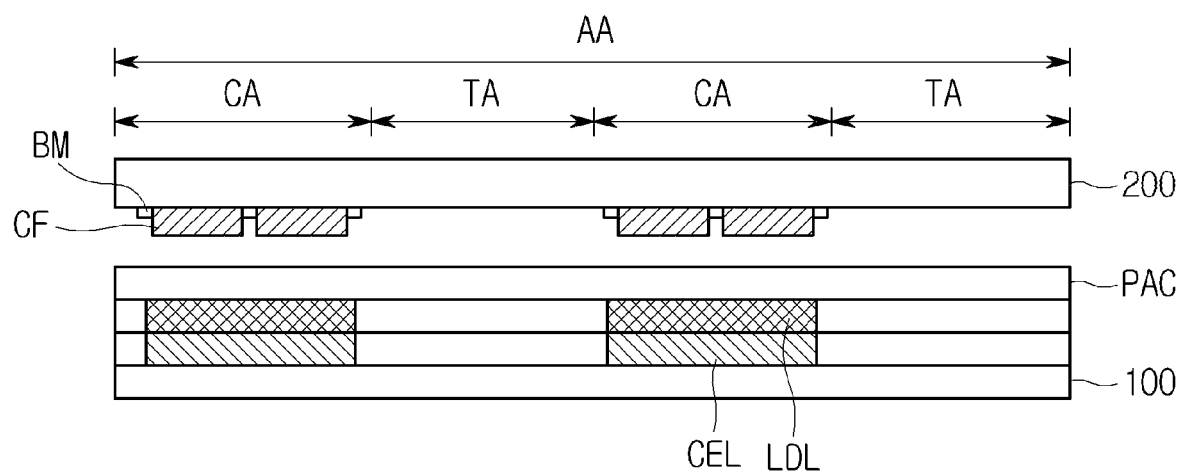
FIG. 11 is a cross-sectional view illustrating a display area according to an embodiment of the present disclosure.
Figure 12:
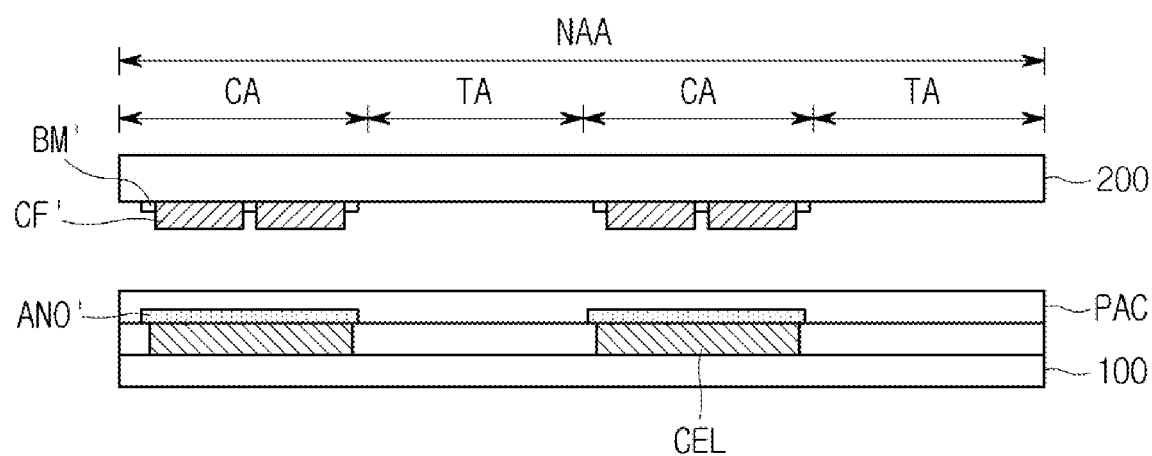
FIG. 12 is a cross-sectional view illustrating a non-display area according to an embodiment of the present disclosure.

In an embodiment in FIG. 6, the circuit part CA has a rectangular shape. Namely the circuit area is in the shape of a rectangle. The shape of the circuit part as stated herein refers to the shape of the circuit area, which may also be called the circuit region area. Similarly, the shape of the transparent part as stated herein refers to the shape of the transparent area. In FIG. 6, and other top plan views, the X dimension is horizontal, namely left to right and the Y dimension is vertical, top to bottom dimension. These are the two dimensions that comprise the area, which can also be considered the footprint of the circuit part, CA. The Z dimension is into the page, as can be seen in FIGS. 11 and 12. In an embodiment in FIG. 7, the area covered by the circuit part CA has a cross shape or a pinwheel shape. In these embodiments, red, green, blue, and white pixels R, G, B, and W may be sequentially arranged from top to bottom, as illustrated in the one unit pixel PXU in FIG. 6. Moreover, the red, the green, the blue, and the white pixels R, G, B, and W may be arranged as illustrated in the one unit pixel PXU in FIG. 7, but the embodiment is not limited thereto.

In addition, in the embodiment, the shape of the circuit part CA and an arrangement state of the pixels PXs arranged at the circuit part CA may be variously modified. Hereinafter, the display panel 50 that has the circuit part CA formed in the cross shape or the pinwheel shape is exemplified so as to describe embodiments.

The transparent part TA is an area excepting the circuit part CA, and is an area at which the circuit parts CA and the light-emitting elements LD are not disposed. The transparent part TA has a light transmitting property, and may be formed to be transparent or translucent so as to pass incident light through. To this end, layers that are stacked on the transparent part TA may be a material having a transparent property or a translucent property. As the circuit part CA and the transparent part TA are provided at the display area AA, the display panel 50 is implemented as a transparent display that not only displays images but also enables to view a background image at an opposite side of the display panel 50.

Figure 8:
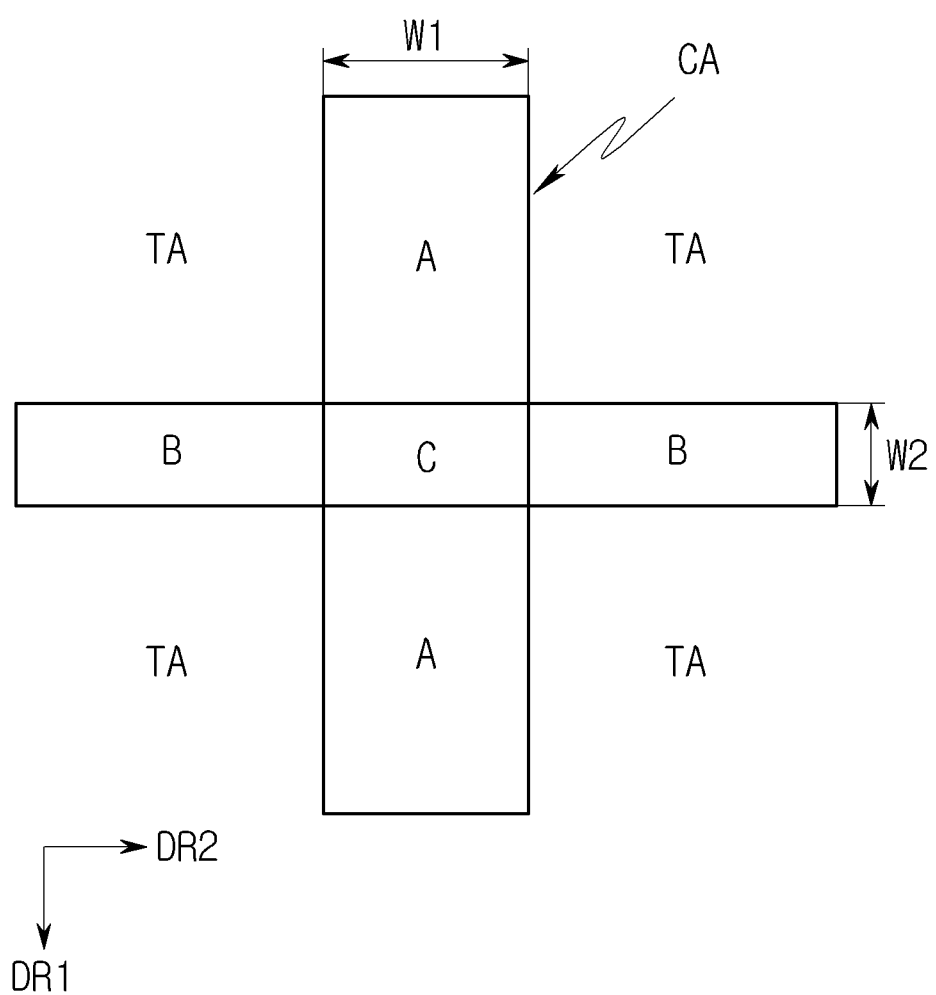
FIG. 8 is an enlarged view of a circuit part illustrated in FIG. 7.

FIG. 8 is an enlarged view of a circuit part illustrated in FIG. 7. The circuit part CA illustrated in FIG. 8 may be the circuit part CA that is arranged at the display area AA or the non-display area NAA.

Referring to FIG. 8, the circuit part CA according to an embodiment of the present disclosure may have a shape of a cross. Specifically, the circuit part CA may include: a first extension part A extending in a first direction DR1; and a second extension part B extending in a second direction DR2 that is generally perpendicular to the first direction DR1, and overlapping the first extension part A. An overlap part C is formed in an area where the first extension part A and the second extension part B overlap with each other. The first direction, DR1 can be considered the Y dimension and the second direction, DR2, the X direction.

In the display area AA, circuit elements that configure at least one pixel PX may be disposed on the first extension part A. The circuit elements may include a transistor, a capacitor, etc. In addition, in the display area AA, wirings for connecting the circuit elements together and for applying a signal to the circuit elements may be disposed on the second extension part B. In general, the wirings occupy less area than the circuit elements, so that a width W1 of the first extension part A is larger than a width W2 of the second extension part B. In this manner, by arranging the circuit elements that have larger areas on the first extension portion A and arranging the wiring that have smaller areas on the second extension portion B, an area of the transparent part TA around the circuit part CA is increased, and a transparency of the display panel 50 may increase.

In the non-display area NAA, circuit elements that configure a part of the stage ST may be disposed on the first extension part A. At this time, circuit elements that perform the same function among circuit elements that configure the stage ST may be disposed on the single first extension part A to form a circuit block. Multiple circuit blocks may be disposed on the single first extension part A.

In the non-display area NAA, first wirings for applying the global signal to the stage ST may be further disposed on the first extension part A. The global signals are more of type and number thereof than the local signals that are described later, and it is beneficial for the global signals to be independently applied for each of the circuit parts CA that are disposed on the non-display area NAA. Therefore, since the number of the first wirings for supplying the global signal is large, the first wirings are disposed on the first expansion part A having a relatively large area.

In the non-display area NAA, second wirings for transmitting and receiving the local signals between the circuit parts CA may be disposed on the second extension part B. The local signals are signals generated from each of the circuit blocks, and may include: a Q node signal for controlling turn-on/turn-off of the pull-up transistors Tup1, Tup2, and Tup3 that are illustrated in FIG. 5; a QB node signal for controlling turn-on/turn-off of the pull-down transistors Tdown1, Tdown2, and Tdown3; the first and the second gate signals; the carry signal CR; an M_o signal for charging/discharging the Q node Q and the QB node QB for pixel sensing. The local signals may be transmitted to other circuit blocks that are spaced apart from each other through the second wirings that are disposed on the second extension part B, or may be output outside the stage ST.

The local signals are generally less in number and type than that of the global signals. Therefore, by arranging the first wirings for the global signals to be on the first extension part A and arranging the second wirings for the local signals to be on the second extension part B, the width W2 of the second extension part B may be narrower than the width W1 of the first extension part A.

In this manner, an area ratio between the first extension part A and the second extension part B in the display area AA is generally the same as an area ratio between the first extension part A and the second extension part B in the non-display area NAA. Therefore, the display area AA and the non-display area NAA may have substantially the same visual appearance.

In the overlap part C, the first wirings extending in the first direction DR1 from the first extension part A and the second wirings extending in the second direction DR2 from the second extension part B may overlap with each other. At least one insulation layer may be disposed between the first wirings and the second wirings so that space between the first wirings and the second wirings may be insulated. The first wirings and the second wirings may be electrically coupled through contact holes formed at the overlap part C.

Figure 9:
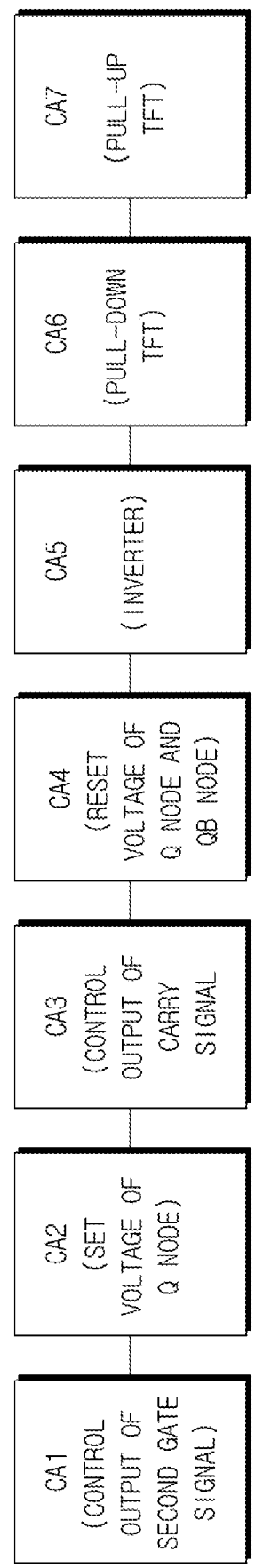
FIG. 9 is a block diagram schematically illustrating circuit parts that configure stages and illustrated in FIG. 8.
Figure 10:
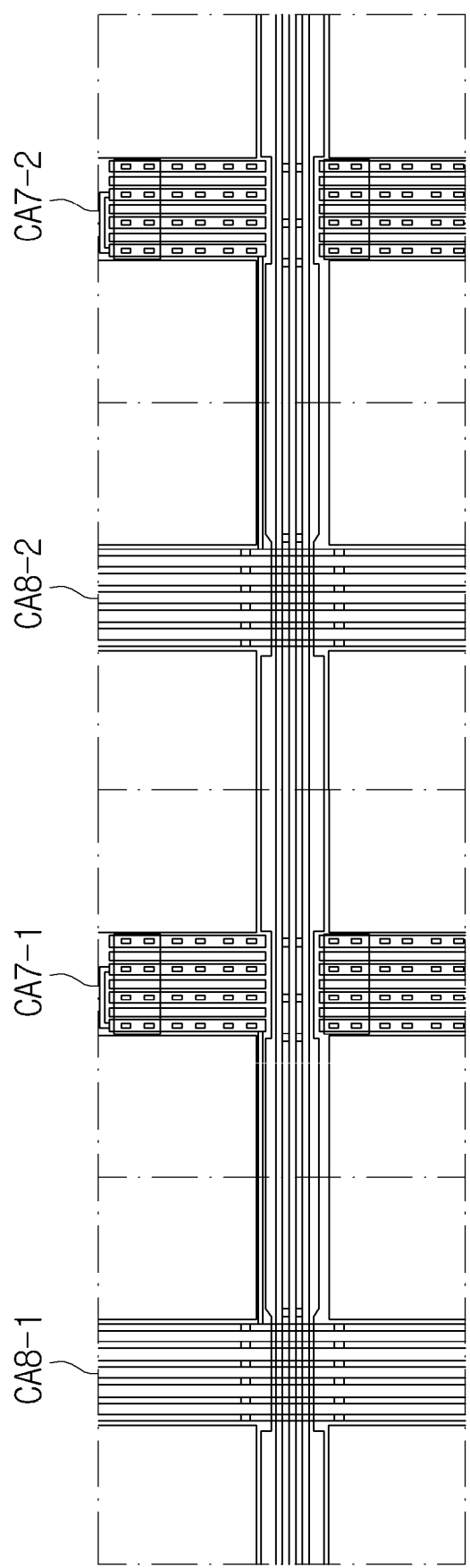
FIG. 10 is a view schematically illustrating an example of a first pull-up transistor.

FIG. 9 is a block diagram schematically illustrating circuit parts that configure stages illustrated in FIG. 8. FIG. 10 is a view schematically illustrating an example of a first pull-up transistor.

Referring to FIGS. 9 and 10, in an embodiment, the single stage ST may be implemented across multiple circuit parts CA1 to CA7. Each of the circuit parts CA may include circuit blocks that are a set of circuit elements that perform the same or similar functions. By disposing the circuit blocks that perform similar functions within a single circuit part CA, the number of the second wirings that couple the circuit parts CA spaced apart from each other may be reduced. To reduce the number of the second wirings, each of the circuit parts CA may be configured to directly generate the local signal beneficial for operating the circuit part CA. In various embodiments, the number of the second wirings that couple the circuit parts CA separated from each other may be three or four, but the embodiment is not limited thereto.

The first circuit part CA1 may control the output of the second gate signals GS21 to GS2$n$ that are for pixel sensing. For example, the first circuit part CA1 may output the second gate signals GS21 to GS2$n$ to the second gate lines GL21 to GL2$n$ during the sensing period in one frame.

In an embodiment, the first circuit part CA1 may include: a first circuit block configured to generate an M_o signal that is for charging/discharging the Q node Q during pixel sensing; a second circuit block configured to reset the QB node QB during pixel sensing; and a third circuit block configured to charge the Q node Q during pixel sensing. The first circuit block may output the M_o signal in response to the sensing selection signal LSP and the carry signal CR from the previous stage. The second circuit block may set the QB node QB to the gate-off voltage in response to the M_o signal output from the first circuit block, the carry signal CR from the previous stage, and the reset signal RST. The third circuit block may set the Q node Q to the gate-on voltage in response to the reset signal RST.

In an embodiment, the first circuit part CA1 may be disposed on an edge of a first side of the stage ST, e.g., an outermost area of the non-display area NAA, so as to reduce an electrical effect from a voltage variation that is generated when the gate driver 20 is operated. Since the first circuit part CA1 is disposed on the outermost area of the non-display area NAA, forming a capacitor within the first circuit part CA1 may be more easily realized.

The second circuit part CA2 is configured to set the voltage of the Q node Q. The output of the gate signal GS21 to GS2$n$ may be controlled since the second circuit part CA2 sets the voltage of the Q node Q. The second circuit part CA2 may include a fourth circuit block configured to charge the Q node Q of the stage ST where the gate signals GS21 to GS2$n$ is to be output. The fourth circuit block may set the Q node Q to the gate-on voltage or the gate-off voltage in response to the carry signal CR from the previous stage.

The third circuit part CA3 may control the output of the carry signal CR. In an embodiment, the third circuit part CA3 may include: a fifth circuit block configured to control a turn-on/turn-off of the third pull-up transistor Tup3; and a sixth circuit block configured to control a turn-on/turn-off of the third pull-down transistor Tdown3.

The fifth circuit block may control the turn-on/turn-off of the third pull-up transistor Tup3 in response to the carry clock signal CCLK. When the third pull-up transistor Tup3 is turned on, the carry signal of the gate-on voltage may be output.

The sixth circuit block may control the turn-on/turn-off of the third pull-down transistor Tdown3 on the basis of the second power source Vdd_even/Vdd_odd. When the third pull-down transistor Tdown3 is turned on, the carry signal at the gate-off voltage may be output.

The fourth circuit part CA4 may reset the voltage of the Q node Q and the QB node QB. In the vertical blank period of one frame, the Q node Q may be reset to the gate low voltage by the fourth circuit part CA4, and the QB node QB may be reset to the gate-on voltage.

In an embodiment, the fourth circuit part CA4 may include: a seventh and an eighth circuit blocks and configured to reset the voltage of the Q node Q; and a ninth and tenth circuit blocks and configured to reset the voltage of the QB node QB.

The seventh circuit block and the eighth circuit block may reset the Q node Q to the gate-off voltage by using the second power source Vdd_even/Vdd_odd and the third power source Vss, in response to the carry signal from the previous stage. The ninth circuit block and the tenth circuit block may reset the QB node QB to the gate-on voltage by using the second power source Vdd_even/Vdd_odd and the third power source Vss.

In an embodiment, since the fourth circuit part CA4 receives the carry signal from the previous stage, the fourth circuit part CA4 may be disposed adjacent to the third circuit part CA3 that outputs the carry signal CR. Although it is illustrated in FIG. 9 that the fourth circuit part CA4 is disposed on a right side of the third circuit part CA3, the fourth circuit part CA4 may be disposed on a left side of the third circuit part CA3. In this manner, the number and length of the second wiring may be reduced since the third circuit part CA3 that outputs the carry signal and the third circuit part CA4 that is operated in response to the carry signal CR output from the circuit part CA3 are disposed adjacent to each other.

The fifth circuit part CA5 may perform an inverter operation. The fifth circuit part CA5 may include an 11th circuit block configured to output a signal that is a signal formed by inverting the voltage of the Q node Q and the QB node QB. The fifth circuit part CA5 may be disposed adjacent to any other circuit part that sets/resets the voltage of the Q node Q and the QB node QB, except for the first circuit part CA1. That is, the fifth circuit part CA5 may be disposed on anywhere between the first circuit part CA1 and the sixth circuit part CA6. Although it is illustrated in FIG. 9 that the fifth circuit part CA5 is disposed between the fourth circuit part CA4 and the sixth circuit part CA6, but the embodiment is not limited thereto and the fifth circuit part CA5 may be relatively free in an arrangement.

The sixth circuit part CA6 may include an 12th and an 13th circuit blocks. Each of the 12th and the 13th circuit blocks may include at least one first pull-down transistor Tdown1, and may output the first gate signals GS11 to GS1$n$ at the gate-off voltage to the first gate lines GL11 to GL1$n$ in response to the voltage of the QB node QB.

The seventh circuit part CA7 may include an 14th circuit block. The 14th circuit blocks may include at least one first pull-up transistor Tup1, and may output the first gate signals GS11 to GS1$n$ at the gate-off voltage to the first gate lines GL11 to GL1$n$ in response to the voltage of the Q node Q.

Generally, the first pull-up transistor Tup1 has the largest area among the transistors that configure the gate driver 20, so that the first pull-up transistor Tup1 may be configured as multiple sub-circuit parts. For example, as illustrated in FIG. 10, the first pull-up transistor Tup1 may be formed of the multiple sub-circuit parts CA7-1 and CA7-2. Each of the multiple sub-circuit parts CA7-1 and CA7-2 may be configured as a part of the first pull-up transistor Tup1. When the first pull-up transistor Tup1 is formed of the multiple sub-circuit parts CA7-1 and CA7-2, a length of a wiring that applies the scan clock signal SCLK to the first pull-up transistor Tup1 may be increased since the first pull-up transistor Tup1 is coupled to the scan clock signal SCLK. As the length of the wiring increases, an area of the second extension part B that is illustrated in FIG. 8 increases. Therefore, the transparency of the display panel 50 may decrease and a visual difference between the display area AA and the non-display area NAA may increase. In order to avoid this problem, the multiple sub-circuit parts CA7-1 and CA7-2 that configure the first pull-up transistor Tup1 may be disposed adjacent to an eighth sub-circuit parts CA8-1 and CA8-2 that are formed only of a scan clock signal wiring. Both the multiple sub-circuit parts CA7-1 and CA7-2 that form the first pull-up transistor Tup1 and the eighth sub-circuit parts CA8-1 and CA8-2 that are formed only of the scan clock signal wiring may be sequentially disposed along the second direction DR2. By using this structure, a circuit area that is sufficient for the first pull-up transistor Tup1 may be secured and an impedance of the scan clock signal SCLK wiring may be reduced. Further, the transparency of the display panel 50 may be secured by preventing an increase of an area of the second extension part B.

In order to reduce length of the first gate lines GL11 to GL1n that extend inside the gate driver 20, an edge of a second side of the gate driver 20, e.g., the sixth circuit part CA6 and the seventh circuit part CA7, may be disposed most adjacent to the display area AA. For example, the sixth circuit part CA6 and the seventh circuit part CA7 may both be disposed nearer the display area AA than the first, second, third, fourth and fifth circuit parts CA1-CA5. Individually, the seventh circuit part CA7 may be disposed directly adjacent the display area AA, and the sixth circuit part CA6 may be disposed adjacent the display area AA (e.g., with the seventh circuit part CA7 disposed therebetween).

In FIG. 9, the gate driver 20 formed of seven circuit parts CA1 to CA7 is illustrated. However, the embodiment is not limited thereto, and the gate driver 20 may be formed of more or less than seven circuit parts. In addition, each of the circuit parts CA1 to CA7 may be formed of a more or fewer number of circuit blocks.

FIG. 11 is a cross-sectional view illustrating a circuit part CA and transparent part TA in the display area according to an embodiment of the present disclosure. Referring to FIG. 11, in the display area AA, the display panel 50 includes the circuit part CA and the transparent part TA. The pixels PXs are disposed on the circuit part CA, and only a transparent insulation layer is disposed on the transparent part TA so as to pass incident light therethrough.

The portions that make up the circuit part itself can be located in any layer and thus be in three dimensions. FIG. 11 shows the Z dimension as up and down and X dimension extending horizontally. For example, the circuit part CA may include: a substrate 100; a circuit element layer CEL disposed on the substrate 100; and a light-emitting element layer LDL. The top plan view, of FIG. 11 can be as shown in FIGS. 6, 7 and 8.

As circuit elements that configure the pixels PXs, at least one transistor, a capacitor, and wirings may be disposed on the circuit element layer CEL. These various circuit elements together comprise the circuit part CA. The transparent insulation layer is disposed between electrodes that configure the circuit element, so that space between the electrodes may be insulated. The circuit elements are covered by a passivation layer and/or an overcoat layer, so that the circuit elements may be protected from a foreign substance. In addition, an uneven upper surface of the circuit elements is covered by the overcoat layer (a planarization layer), so that diffuse-reflection of external light caused by an uneven surface may be prevented.

A light-emitting element is disposed on the light-emitting element layer LDL. The light-emitting element includes an anode electrode, a light-emitting layer, and a cathode electrode. These various circuit elements together also comprise the circuit part CA. When the display panel 50 is a top emission type, the anode electrode may be a reflective electrode and the cathode electrode may be a transmissive electrode. However, when the display panel 50 is a bottom emission type, the anode electrode may be a transmissive electrode and the cathode electrode may be a reflective electrode. Hereinafter, embodiments of the display panel 50 that is in the top emission type will be exemplified and described.

The circuit element and the light-emitting element may be covered by an encapsulation layer PAC. The encapsulation layer PAC serves to prevent external moisture from penetrating into the circuit element and the light-emitting element. The encapsulation layer PAC may be formed of an inorganic insulating material, or may be formed in a structure having the inorganic insulating material and an organic insulating material are sequentially stacked, but not limited thereto.

A cover substrate 200 may be formed on an upper portion of the encapsulation layer PAC. The cover substrate 200 may be bonded to the encapsulation layer PAC by an adhesive, etc.

A color filter CF may be formed between the encapsulation layer PAC and the cover substrate 200. The color filter CF may be disposed to overlap the light-emitting element. This CF and BM together also comprise the circuit part CA. The color filter CF is a wavelength-selective optical filter that selectively transmits a partial wavelength band of incident light by transmitting light in a particular wavelength band and blocking light in other particular wavelength bands. The color filter CF may be formed of a photosensitive resin including a colorant, such as a pigment, a dye, or the like. The light that is output from the light-emitting element and passes through the color filter CF may have any one among red, green, and blue colors. The color filter CF may be omitted for the pixel PX that displays a white color. A black matrix BM is formed between the color filter CF, so that a light leakage phenomenon between light-emitting areas may be prevented.

Figure 13:
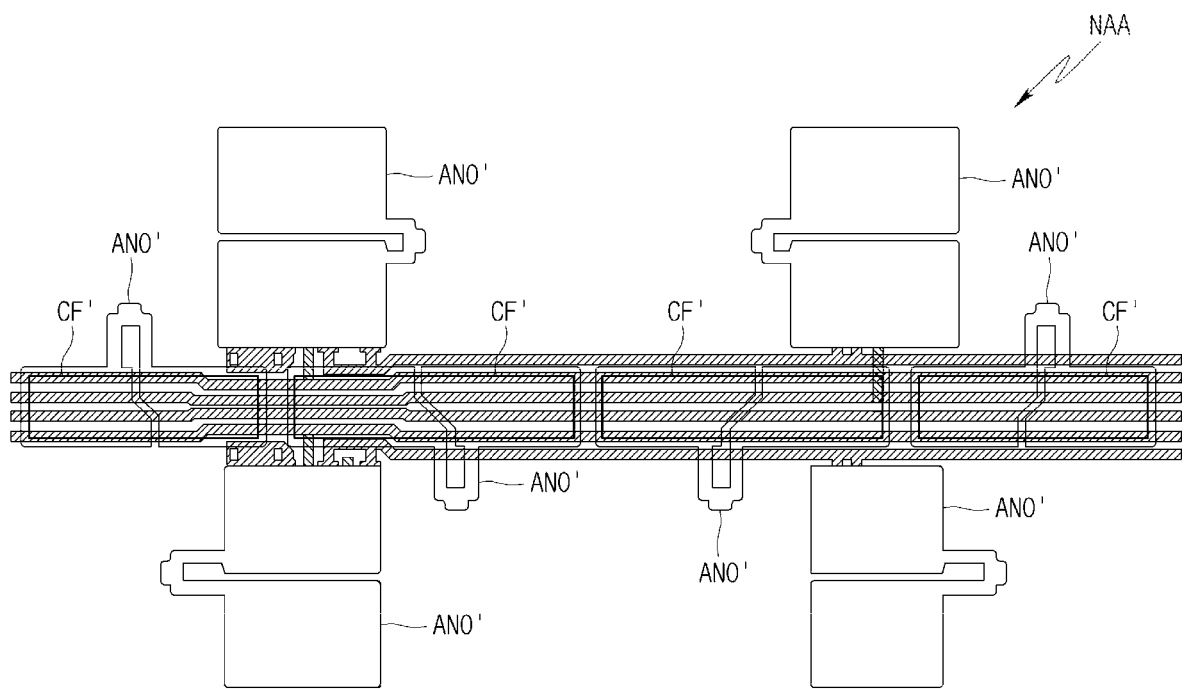
FIG. 13 is a plan view illustrating an arrangement state of a dummy reflective pattern and a dummy color filter in FIG. 12.

FIG. 12 is a cross-sectional view illustrating a non-display area according to an embodiment of the present disclosure, and FIG. 13 is a plan view illustrating an arrangement state of a dummy reflective pattern and a dummy color filter in FIG. 12.

Referring to FIG. 12, in the non-display area NAA, the display panel 50 includes the circuit part CA and the transparent part TA. The circuit blocks of the gate driver 20 are disposed on the circuit part CA, and only the transparent insulation layers are disposed on the transparent part TA so that incident light is passed therethrough. In FIG. 12, the elements that are part of the circuit part include CEL and ANO' as well as CF' and BM'.

In various embodiments, the non-display area NAA has a layer structure that is generally similar to that of the display area AA. That is, the circuit block disposed on the non-display area NAA may be formed in a stacked-layer structure that is similar to that of the pixel PX. For example, since the gate driver 20 does not perform a light-emitting operation, the gate driver 20 may not benefit from inclusion of the color filter CF and the anode electrode. However, in order to provide a visual similarity with the display area AA, the gate driver 20 may include a dummy color filter CF' and a dummy reflective pattern ANO'. The dummy reflective pattern ANO' may be or include a dummy reflective layer, and may be referred to as a dummy reflective layer ANO'. The dummy reflective pattern ANO' may also be referred to as a dummy anode electrode ANO', with the understanding that the dummy anode electrode ANO' resembles the anode electrode, but may not provide electrical functions of the anode electrode, and may provide optical functions (e.g., reflectivity) of the anode electrode. Hereinafter, a specific structure of the gate driver 20 will be described with reference to the cross-sectional view of the gate driver 20.

For example, the circuit part CA may include the substrate 100 and the circuit element layer CEL that is disposed on the substrate 100. In the circuit element layer CEL, at least one transistor, a capacitor, and wirings may be disposed as circuit elements that configure the circuit block. The region in which the circuit part is located can be consider the circuit region. The transparent insulation layer is disposed between electrodes that configure the circuit element, so that space between the electrodes may be insulated. The circuit elements are covered by a passivation layer and/or an overcoat layer, so that the circuit elements may be protected from a foreign substance. In addition, the overcoat layer is a planarization layer that flattens an uneven surface formed on an upper surface of the circuit elements, so that a difference in visual sensation with the display area AA caused by external light being diffuse-reflected by the uneven surface may be prevented.

The dummy reflective pattern ANO' may be formed on the circuit element layer CEL. The dummy reflective pattern ANO' may be formed of the same material of the anode electrode that is disposed on the display area AA. For example, the dummy reflective pattern ANO' may be formed of a reflective electrode. In an embodiment, the dummy reflective pattern ANO' is formed of a reflective layer, and the reflective layer may be formed of aluminum (Al), copper (Cu), silver (Ag), nickel (Ni), or an alloy thereof.

A disposition on a plane of the dummy reflective pattern ANO' within the circuit part CA may correspond to a disposition of the anode electrode within the pixel PX. In addition, the dummy reflective pattern ANO' may have the same or similar shape as the anode electrode, but is not limited thereto. The dummy reflective pattern ANO' may be formed in the same single process as the anode electrode, but is not limited thereto.

In an embodiment, in order to prevent interference caused by coupling with surrounding elements, a specific DC power source may be applied to the dummy reflective pattern ANO'. For example, the DC power source may be the third power source Vss, but is not limited thereto. In another embodiment, the dummy reflective pattern ANO' may not be applied with a power source and may be floated.

The dummy reflective pattern ANO' may reflect external light. By the dummy reflective pattern ANO', the display area AA on which the pixels PXs are disposed and the non-display area NAA on which the gate driver 20 is disposed may have generally the same reflectance, and the visual similarity between the display area AA and the non-display area NAA may be improved.

The dummy reflective pattern ANO' may be covered by the encapsulation layer PAC.

The cover substrate 200 may be formed on an upper portion of the encapsulation layer PAC. The cover substrate 200 may be bonded to the encapsulation layer PAC by an adhesive, etc.

The dummy color filter CF' may be further formed between the encapsulation layer PAC and the cover substrate 200. The dummy color filter CF' may be disposed to overlap the dummy reflective pattern ANO'. The dummy color filter CF' may be formed of the same material as the color filter CF. For example, the dummy color filter CF' may be formed of a photosensitive resin including a colorant, such as a pigment, a dye, or the like. The black matrix BM' is formed between the dummy color filter CF', so that a light leakage phenomenon between light-emitting areas may be prevented.

A disposition on a plane of the dummy reflective pattern CF' within the circuit part CA may correspond to a disposition of the color filter CF within the pixel PX. For example, when the pixels PXs of the red, green, blue, and white colors are arranged in a cross shape on the display area AA, and the dummy color filter CF' of the red, green, blue colors may be arranged in a cross shape on the non-display area NAA. In a position that corresponds to the pixel PX of the white color, the dummy color filter CF' may be omitted.

In addition, the dummy color filter CF' may have the same or similar shape as the color filter CF, but is not limited thereto. The dummy color filter CF' may be formed by the same single process as the color filter CF, but is not limited thereto.

By the dummy color filter CF', the display area AA on which the pixels PXs are disposed and the non-display area NAA on which the gate driver 20 is disposed may have generally the same visual sensation, and the visual similarity between the display area AA and the non-display area NAA may be improved.

The embodiments of the present disclosure have been described above with reference to the accompanying drawings, but it will be understood that the technical configuration of the present disclosure described above may be practiced in other specific forms without changing the technical spirit or features of the present disclosure by those skilled in the art to which the present disclosure pertains. Therefore, the embodiments described above are to be understood in all respects as illustrative and not restrictive. In addition, the scope of the present disclosure is indicated by the claims below, rather than the detailed description. In addition, all modifications or variations derived from the meaning and scope of the claims and their equivalent concepts should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driver, comprising:
a plurality of stages outputting gate signals to a plurality of gate lines respectively,
wherein each stage includes:
a plurality of circuit parts having circuit elements disposed thereon, the plurality of circuit parts spaced apart from each other; and
a plurality of transparent parts disposed between the plurality of circuit parts, the plurality of transparent parts permitting external light to pass through,
wherein the plurality of stages includes at least a first stage and a second stage,
wherein the first stage and the second stage each includes at least a first circuit part and a second circuit part,
wherein the first circuit part of the first stage and the first circuit part of the second stage are configured to perform the same function, and the second circuit part of the first stage and the second circuit part of the second stage are configured to perform the same function, and
wherein each of the plurality of circuit parts includes at least one circuit block required to perform a predetermined function of each of the plurality of circuit parts, and
wherein the plurality of circuit parts includes:
the first circuit part performing a function of controlling an output of a second gate signal provided to pixels for pixel sensing;
the second circuit part performing a function of setting a voltage of a first node disposed on the gate driver;
a third circuit part performing a function of controlling an output of a carry signal provided to another stage that is disposed after a corresponding stage;
a fourth circuit part performing a function of resetting the voltage of the first node and a voltage of a second node that is disposed on the gate driver, in response to the carry signal received from another stage that is disposed before the corresponding stage;
a fifth circuit part performing a function of inverting and outputting a signal applied to the first node and the second node;
a sixth circuit part performing a function of outputting a first gate signal at a gate-off voltage through at least one pull-down transistor that is turned on in response to the voltage of the second node; and
a seventh circuit part performing a function of outputting the first gate signal at a gate-on voltage through at least one pull-up transistor that is turned on in response to the voltage of the first node.

2. The gate driver of claim 1, wherein each of the plurality of circuit parts comprises:
a first extension part extending in a first direction, wherein the circuit elements thereof are on the first extension part; and
a second extension part extending in a second direction perpendicular to the first direction, wherein second wirings are on the second extension part, the second wirings configured to couple to each other circuit parts that are spaced apart from each other of the plurality of circuit parts.

3. The gate driver of claim 2, wherein a width of the first extension part in the second direction is greater than a width of the second extension part in the first direction.

4. The gate driver of claim 3, further comprising a plurality of first wirings configured to apply global signals to each of the plurality of circuit parts, wherein the global signals include at least one of a scan clock signal, a carry clock signal, a start signal, a reset signal, a sensing selection signal, a first power source, a second power source, and a third power source.

5. The gate driver of claim 1, wherein the first circuit part is disposed adjacent to an edge of a first side of the gate driver.

6. The gate driver of claim 1, wherein the fourth circuit part is disposed adjacent to the third circuit part that is configured to output the carry signal.

7. The gate driver of claim 1, wherein the sixth circuit part and the seventh circuit part are disposed adjacent to an edge of a second side of the gate driver.

8. The gate driver of claim 1, wherein the seventh circuit part comprises:
a plurality of sub-circuit parts each spaced apart from others of the plurality of sub-circuit parts; and
the transparent parts of the plurality of transparent parts disposed between the sub-circuit parts,
wherein the plurality of sub-circuit parts includes:
first sub-circuit parts, each of which is configured as a part of the pull-up transistor; and
second sub-circuit parts having the first wirings thereon, the first wirings being configured to apply a scan clock signal to the pull-up transistor.

9. The gate driver of claim 8, wherein
at least one of the first circuit part, the second circuit part, the third circuit part, the fourth circuit part, the fifth circuit part, the sixth circuit part and the seventh circuit part is configured to generate local signals for operating at least one other of the first, second, third, fourth, fifth, sixth or seventh circuit parts, and
the local signals include at least one of:
a first signal for controlling turn-on/turn-off of the pull-up transistor,
a second signal for controlling turn-on/turn-off of the pull-down transistor,
the carry signal,
the first and the second gate signals and
a third signal for charging/discharging the first node and the second node for pixel sensing.

10. The gate driver of claim 1, wherein the circuit parts further comprise:
a substrate;
a circuit element layer disposed on the substrate, and on which the circuit elements are disposed;
a planarization layer configured to cover the circuit elements that are disposed on the circuit element layer;
a dummy reflective layer disposed on the planarization layer; and
an encapsulation layer configured to cover the dummy reflective layer,
wherein the dummy reflective layer is formed of a reflective electrode.

11. The gate driver of claim 1, wherein the circuit parts further comprise:
a substrate;

a circuit element layer disposed on the substrate, and on which the circuit elements are disposed;

a planarization layer configured to cover the circuit elements that are disposed on the circuit element layer;

an encapsulation layer formed on the planarization layer;

a cover substrate disposed on an upper portion of the encapsulation layer; and a dummy color filter disposed between the encapsulation layer and the cover substrate, wherein the dummy color filter is formed of a photosensitive resin comprising a colorant.

12. A display device, comprising:

a display panel including a display area having pixels thereon, and a non-display area that surrounds the display area; and a gate driver disposed on the non-display area and configured to apply gate signals to the pixels through gate lines, wherein each of the display area and the non-display area includes:
  a plurality of circuit parts on which circuit elements are disposed, the plurality of circuit parts being disposed to be spaced apart from each other; and
  transparent parts disposed between the plurality of circuit parts, the transparent parts passing external light through, wherein the gate driver includes a plurality of stages each outputting a gate signal to a gate line, wherein each stage includes the plurality of circuit parts and the transparent parts in the non-display area, and wherein the plurality of stages includes at least a first stage and a second stage, wherein the first stage and the second stage each includes at least a first circuit part and a second circuit part, wherein the first circuit part of the first stage and the first circuit part of the second stage are configured to perform the same function, and the second circuit part of the first stage and the second circuit part of the second stage are configured to perform the same function, and wherein each of the plurality of circuit parts includes at least one circuit block required to perform a predetermined function of each of the plurality of circuit parts, and wherein the plurality of circuit parts of each stage includes:
  the first circuit part performing a function of controlling an output of a second gate signal provided to the pixels for pixel sensing;
  the second circuit part performing a function of setting a voltage of a first node coupled to the gate driver;
  a third circuit part performing a function of controlling an output of a carry signal provided to another stage that follows a corresponding stage;
  a fourth circuit part performing a function of resetting the voltage of the first node and a voltage of a second node that is coupled to the gate driver, in response to the carry signal received from another stage that precedes the corresponding stage;
  a fifth circuit part performing a function of inverting and outputting a signal applied to the first node and the second node;
  a sixth circuit part performing a function of outputting a first gate signal at a gate-off voltage through at least one pull-down transistor that is turned on in response to the voltage of the second node; and
  a seventh circuit part performing a function of outputting the first gate signal at a gate-on voltage through at least one pull-up transistor that is turned on in response to the voltage of the first node.

13. The display device of claim 12, wherein each of the circuit parts comprises:
  a first extension part extending in a first direction, the first extension part having the circuit elements thereon; and
  a second extension part extending in a second direction perpendicular to the first direction, the second extension part having second wirings thereon, wherein the second wirings couple the circuit parts to each other,
  wherein a width of the first extension part in the second direction is greater than a width of the second extension part in the first direction.

14. The display device of claim 12, wherein the first circuit part is disposed adjacent to an edge of the display panel in the non-display area, and the sixth and the seventh circuit parts are disposed nearer to the display area than the first, second, third, fourth and fifth circuit parts.

15. The display device of claim 12, wherein the fourth circuit part is disposed adjacent to the third circuit part that is configured to output the carry signal.

16. The display device of claim 12, wherein the seventh circuit part comprises:
  a plurality of sub-circuit parts disposed to be spaced apart from each other; and
  the transparent parts disposed between the sub-circuit parts,
  wherein the plurality of sub-circuit parts comprises:
    first sub-circuit parts, each of is the first sub-circuit parts being configured as a part of the pull-up transistor; and
    second sub-circuit parts having first wirings thereon, the first wirings configured to apply a scan clock signal to the pull-up transistor.

17. The display device of claim 12, wherein the circuit parts in the display area comprise:
  a first region of a substrate;
  a first region of a circuit element layer disposed on the substrate, the circuit element layer having the circuit elements thereon;
  a first region of a planarization layer configured to cover the circuit elements that are on the circuit element layer;
  a first region of a light-emitting element layer disposed on the planarization layer and including light-emitting elements, each of the light-emitting elements including:
    an anode electrode,
    a cathode electrode, and
    a light-emitting layer disposed between the anode electrode and the cathode electrode;
  a first region of an encapsulation layer configured to cover the light-emitting element layer;
  a first region of a cover substrate disposed on an upper portion of the encapsulation layer; and
  a color filter disposed between the encapsulation layer and the cover substrate,
  wherein each of the circuit parts in the non-display area includes:
    a second region of the substrate;
    a second region of the circuit element layer;
    a second region of the planarization layer;
    a dummy reflective layer disposed on the second region of the planarization layer; and
    a second region of the encapsulation layer configured to cover the dummy reflective layer, wherein the dummy reflective layer includes substantially the same material as the anode electrode.

18. The display device of claim 12, wherein the circuit parts in the display area comprise:
- a first region of a substrate;
- a first region of a circuit element layer disposed on the substrate, and having the circuit elements thereon;
- a first region of a planarization layer configured to cover the circuit elements that are disposed on the circuit element layer;
- a first region of a light-emitting element layer disposed on the planarization layer and provided with light-emitting elements, each of the light-emitting elements comprising:
  - an anode electrode,
  - a cathode electrode, and
  - a light-emitting layer disposed between the anode electrode and the cathode electrode;
- a first region of an encapsulation layer configured to cover the light-emitting element layer;
- a first region of a cover substrate disposed on an upper portion of the encapsulation layer; and
- a color filter disposed between the encapsulation layer and the cover substrate, and wherein the circuit parts in the non-display area include:
- a second region of the substrate;
- a second region of the circuit element layer;
- a second region of the planarization layer;
- a second region of the encapsulation layer disposed on the second region of the planarization layer;
- a second region of the cover substrate; and
- a dummy color filter disposed between the second region of the encapsulation layer and the second region of the cover substrate, wherein the dummy color filter includes substantially the same material as the color filter.

19. The display device of claim 12, wherein the pixels comprise red, green, and blue pixels, and the plurality of circuit parts of the gate driver have substantially the same size and substantially the same shape as the red, green, and blue pixels.

20. The display device of claim 12, wherein the transparent parts disposed on the display area and the transparent parts disposed on the non-display area have substantially the same shape.

* * * * *